United States Patent
Sanjurjo et al.

[11] Patent Number: 5,855,678
[45] Date of Patent: Jan. 5, 1999

[54] FLUIDIZED BED REACTOR TO DEPOSIT A MATERIAL ON A SURFACE BY CHEMICAL VAPOR DEPOSITION, AND METHODS OF FORMING A COATED SUBSTRATE THEREWITH

[75] Inventors: Angel Sanjurjo, San Jose; Kai-Hung Lau, Cupertino; David M. Lowe, Hayward; Liqiang Jiang, San Jose, all of Calif.

[73] Assignee: SRI International, Menlo Park, Calif.

[21] Appl. No.: 847,145

[22] Filed: Apr. 30, 1997

[51] Int. Cl.[6] ..................................................... C23C 16/00
[52] U.S. Cl. ........................... 118/715; 118/724; 118/725
[58] Field of Search ..................................... 118/715, 724, 118/725

[56] References Cited

U.S. PATENT DOCUMENTS

| | | | |
|---|---|---|---|
| 4,027,607 | 6/1977 | Pan et al. | 118/629 |
| 4,574,093 | 3/1986 | Cox | 427/86 |
| 4,585,560 | 4/1986 | Sanjurjo | 156/613 |
| 4,748,052 | 5/1988 | Allen | 427/213 |
| 5,054,420 | 10/1991 | Raghavan et al. | 118/715 |
| 5,139,762 | 8/1992 | Flagela | 423/349 |
| 5,149,514 | 9/1992 | Sanjurjo | 423/344 |
| 5,171,734 | 12/1992 | Sanjurjo et al. | 505/1 |
| 5,227,195 | 7/1993 | Sanjurjo | 427/248.1 |
| 5,244,698 | 9/1993 | Ishihara et al. | 427/563 |

FOREIGN PATENT DOCUMENTS

| | | |
|---|---|---|
| 55-23025 | 2/1980 | Japan . |
| 57-145021 | 9/1982 | Japan . |
| 57-175797 | 10/1982 | Japan . |
| 59-107917 | 6/1984 | Japan . |

*Primary Examiner*—R. Bruce Breneman
*Assistant Examiner*—Jeffrie R. Lund
*Attorney, Agent, or Firm*—Kenneth Barovsky; Bozicevic & Reed LLP

[57] ABSTRACT

A fluidized-bed reactor for the chemical vapor deposition of a coating on a substrate surface is described. The reactor enables high rates of deposition and a highly homogeneous coating by modifying the boundary layer formed between the gasified reactive gas stream and the substrate. The boundary layer is minimized by the presence of an exhaust outlet placed in close proximity to the center of the surface of the substrate and/or the presence of a gas inlet capable of injecting a tangential stream of gas which results in a swirling radial flow of reactive gas. Methods of forming a metal coating on a surface of a substrate using the reactor are provided as well.

64 Claims, 6 Drawing Sheets

FLUIDIZED BED REACTOR TO DEPOSIT A MATERIAL ON A SURFACE BY CHEMICAL VAPOR DEPOSITION, AND METHODS OF FORMING A COATED SUBSTRATE THEREWITH

TECHNICAL FIELD

This invention relates generally to the deposition of materials on a surface. More particularly, this invention relates to a reactor to deposit a polycrystalline silicon film suitable for use in the manufacture of solar cells and to methods of depositing silicon using such a reactor.

BACKGROUND

Deposition of silicon on a substrate by chemical vapor deposition (CVD) is practiced routinely in the semiconductor and tool industries. Atmospheric pressure CVD, low pressure CVD and plasma-assisted CVD are examples of commonly used processes. However, the high cost of capital equipment, i.e., the "reactor," and/or operation of the equipment result in high overall cost of the product and limit the commercial utility of CVD for depositing thick layers of silicon.

U.S. Pat. Nos. 5,227,195 and 4,582,560 to Sanjurjo, the disclosures of which are incorporated herein by reference, disclose a reactor design that takes advantage of the high heat and mass transfer rates of a fluidized bed reactor (FBR) and combines this with CVD chemistry. In particular, these patents teach the use of subhalide chemistry and a mode of feeding reactants in a condensed phase into an FBR-CVD reactor, a design that was well adapted to coat a substrate located inside the fluidized bed. However, when the same design is used to coat a substrate situated outside the bed, the gas species generated in the bed flows laminarly around the substrate creating a boundary layer as shown in FIG. 1. The formation of such a boundary layer limits the rate of coating deposition on a substrate located outside the bed.

The overall coating deposition rate at a given temperature may be increased by a combination of (a) enhancing the gas-to-solid mass transfer rate and (b) increasing the partial chemical potential gradient between the bed and the substrate surface. However, the overall rate of deposition is limited by the concentration gradient between the bulk of the gas phase as it flows out of the bed and past the substrate and the surface of the substrate.

For a typical substrate the equivalent boundary layer thickness will be of a magnitude similar to its size. Thus, for a 10 cm-diameter solar cell wafer, the thickness of the boundary layer could be 5 cm or greater for linear gas flow velocities typical in a conventional fluidized bed reactor, e.g., about 5 cm/s.

Locating the substrate near the top of the bed, e.g., approximately 1 mm from the bed, can significantly increase gas-to-solid mass transfer but it requires elaborate and expensive heat management designs and at best provides relatively slow deposition (1 micron per minute) of high quality epitaxial thin layers (typically 1 to 2 microns thick). For very fast deposition of polycrystalline silicon layers (4 microns per minute or greater) up to 100 $\mu$m thick, a faster deposition approach would be desirable.

SUMMARY OF THE INVENTION

Accordingly, it is a primary object of the invention to provide an FBR-CVD reactor in which the rate of coating deposition is increased and in which a highly homogeneous deposit layer is produced.

It is another object of the invention to provide such a reactor comprising a gas outlet that serves as an exhaust port.

It is yet another object of the invention to provide such a reactor comprising a gas inlet for introducing a tangential jet of gas.

It is still another object of the invention to provide a method for coating a substrate in such a fluidized bed reactor.

Additional objects, advantages and novel features of the invention will be set forth in part in the description that follows, and in part will become apparent to those skilled in the art upon examination of the following, or may be learned by practice of the invention.

In one aspect of the invention, a reactor is provided for depositing a coating on the surface of a substrate. The reactor is a fluidized-bed reactor comprising (a) a bed zone containing a fluidized bed of particles of a reactive coating source material, (b) a means for heating the bed zone, (c) a first gas inlet for introducing a motive stream of reactive gas into the reactor, (d) a substrate zone above the fluidized bed in which the substrate to be coated is situated, (e) a means for heating the substrate such that the temperature of the substrate is less than the temperature of the bed zone, and (f) a gas outlet located within the reactor above the bed zone and below the substrate zone, in proximity to the surface of the substrate to be coated.

In another aspect of the invention, a reactor is provided that comprises (a) a bed zone, (b) a means for heating the bed zone, (c) a first gas inlet means, (d) a substrate zone, and (e) a means for heating the substrate, as described above, and further comprising (f) a second gas inlet means situated within the reactor below the substrate zone and above the bed zone in close proximity to the surface of the substrate to be coated, wherein the inlet introduces a gas jet tangential to the flow of reactive gas.

In still another aspect of the invention, a reactor is provided that comprises components (a) through (e), as well as (f) a gas outlet and (g) a second gas inlet means as described above.

In a further aspect of the invention, a reactor is provided as described above in which the substrate is heated to a temperature greater than the temperature of the bed zone.

In yet another aspect of the invention, a method is provided for forming a coating on a surface of a substrate comprising (a) reacting in a first reaction zone of a reactor as described above a metal reactant M selected from the group consisting of Al, Ti, V, Cr, Zr, Nb, Mo, Hf, Ta, W, and Si with a halide-containing reactant selected from the group consisting of $X_2$, HX, M'$X_a$, and M'$X_{(a-b)}H_b$, wherein X is F, Cl, Br, or I, M' is a metal M, Pb, Ge, Ag, Sn, Ga, In, Cu, Se, or a mixture thereof, a is the maximum oxidation state or valence of metal M', and b has a numerical value between 1 and a-1, to form a reactive intermediate, and (b) contacting said reactive intermediate in a second reaction zone in said reactor with the surface of the substrate, thereby forming a coating on the surface of the substrate.

DETAILED DESCRIPTION OF THE INVENTION

Figure 1:
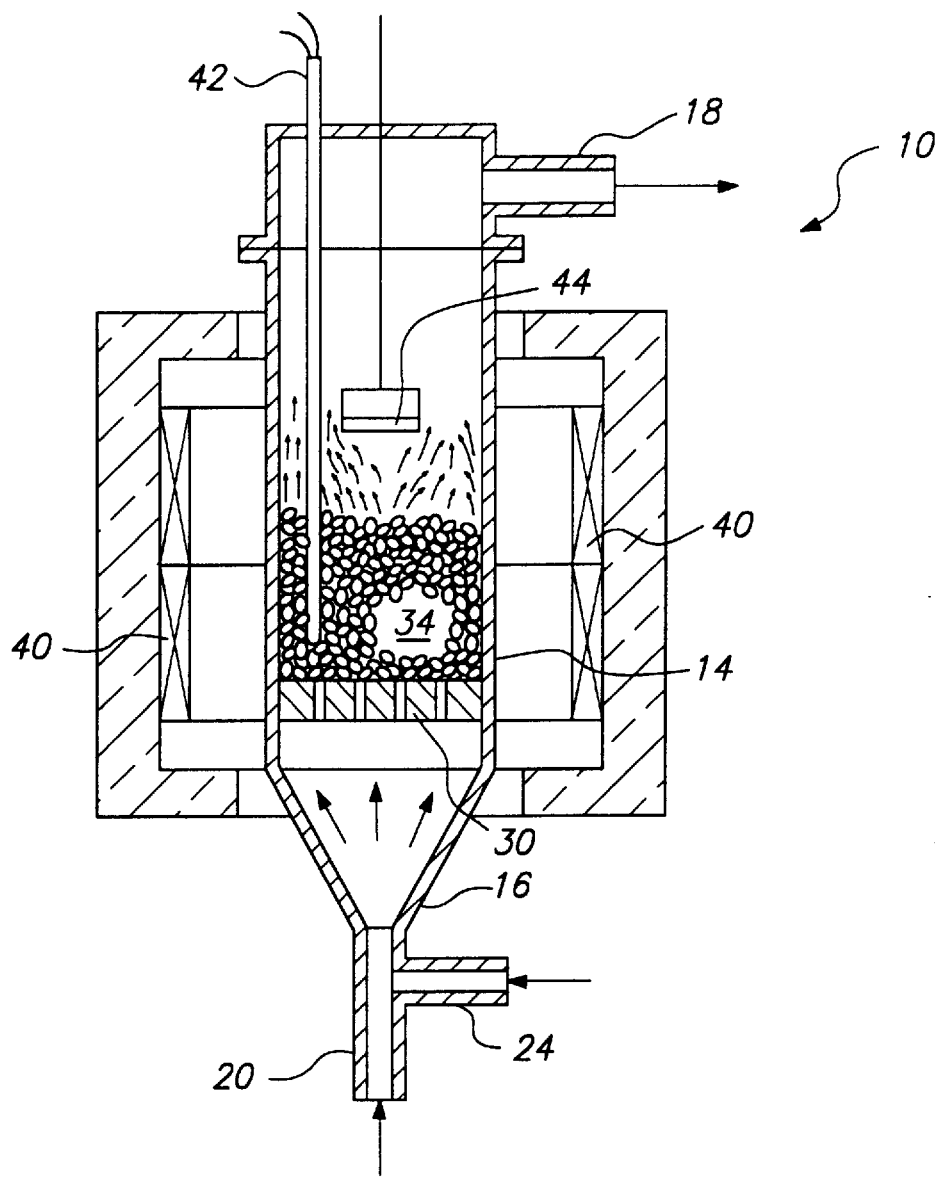
FIG. 1 is a vertical cross-sectional view of the moving bed reactor of U.S. Pat. No. 5,227,195, showing the formation of a boundary layer when the substrate is suspended above the particle bed.

The practice of the present invention will employ, unless otherwise indicated, conventional techniques that are within the skill of the art of deposition of thin films by chemical vapor deposition. Such techniques are explained fully in the literature.

Before describing the present invention in detail, it is to be understood that this invention is not limited to a particular metal reactants, methods of fluidizing particle beds, halide-containing reactants, or the like, as such may vary. It is also to be understood that the terminology used herein is for the purpose of describing particular embodiments only, and is not intended to be limiting.

It must be noted that, as used in this specification and the appended claims, the singular forms "a," "an" and "the" include plural referents unless the content clearly dictates otherwise. Thus, for example, reference to "a metal reactant" includes mixtures of more than one metal reactant, reference to "a reactive intermediate" includes two or more such intermediates, reference to "an aperture" includes more than one aperture, and the like.

The operation of the FBR-CVD reactor is described in detail in U.S. Pat. No. 5,227,195 to Sanjurjo. Briefly, the method for forming a metallic coating on a substrate in such a reactor comprises reacting the metal with a halide-containing reactant in a first reaction zone of a moving bed reactor to provide a reactive intermediate capable of forming a coating. The coating comprises a decomposition and/or a disproportionation product of the reactive intermediate.

The initial reaction of the metal reactant with the halide-containing reactant is conducted at atmospheric pressure to form a reactive intermediate. This initial reaction is carried out at a temperature ranging from about 200° C. to about 3000° C. The temperature of the bed zone is typically about 200° C. to about 1000° C. in a reactor in which the temperature of the substrate is greater than that of the bed zone. The bed zone is typically maintained in the temperature range of about 1000° C. to about 3000° C. in a reactor in which the temperature of the substrate is less than that of the bed zone.

This temperature range is maintained within the reaction zones of the reactor by any convenient heating means such as conduction heating, convention heating, resistance heating, radio-frequency ("RF") heating, microwave heating, radiation heating, laser heating, arc heating, or gas heating.

The metal reactant "M" is any metal or mixture of metals capable of reacting with a halide-containing reactant to form a metal halide intermediate, regardless of the instability of the reaction intermediate. Such metals include the transition metals Ti, V, Cr, Zr, Nb, Mo, Hf, Ta, and W, as well as Al, Si and B. While it is recognized that silicon and boron are not technically considered to be metals, the use of the term "metal reactant" herein will be understood to include metalloids such as Si and B as well as those elements traditionally recognized as metals.

The metal reactant is preferably provided in the form of particles having a size of from about 10 $\mu$m to about 1000 $\mu$m. However, the metal reactant may also be in other forms such as foils, fibers and other shapes which give dispersions with large surface-to-volume ratios. The metal reactant is reacted with the halide-containing reactant by placing the metal reactant in the moving bed reactor. An inert gas may be used to fluidize the bed or the particles may be rotated, moved by gravity, vibration, or any other suitable means which will move or agitate the particle bed. The particles are preferably fluidized using a gas, e.g., the gaseous halide-containing reactant.

Included in the definition of a halide-containing reactant are compounds having the formula $X_2$, HX, M'$X_a$, or M'$X_{(a-b)}H_b$, where X is F, Cl, Br, or I, M' is a metal M as defined above, Pb, Ge, Ag, Sn, Ga, In, Cu, and mixtures thereof, preferably M is Si, a is the maximum oxidation state or valence of the metal M' and b has a numerical value of from 1 to a-1.

By use of the term "gaseous" is meant that the halogen-containing reactant is introduced into the first reaction zone as a gas or a vapor at the temperature of operation. When the halogen-containing reactant is a vapor, for example, it may be introduced into the first reaction zone with a carrier gas.

The substrate may comprise any material capable of withstanding the temperatures that will be used in the reactor to form the coating. Thus, most metallic or ceramic materials will be suitable substrate materials on which the coating may be deposited. Examples of other suitable substrate materials include metals such as Cu, Ni, Fe, alloys such as steels, silicon-coated substrates, monolithic ceramics such as $Al_2O_3$, $ZrO_2$, $SiO_2$, SiC, $Si_3N_4$, TiN, etc., or fibers, whiskers, foils, sheets, ribbons or powders of any of the above, or composites thereof.

By way of illustration and not of limitation, when the metal reactant is silicon and the halide-containing reactant is chlorine, the silicon may react with the chlorine according to the following equation:

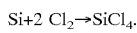

The $SiCl_4$ may, in turn, then further react with the silicon present in the reactor to form equilibriums of the following species:

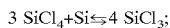

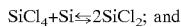

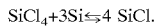

When hydrogen is also present in the equilibrium, for example by the use of HCl as the halogen-containing reactant, the following reactions are also possible:

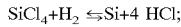

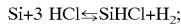

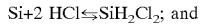

Some of these subhalide and halosilane species are very reactive and it is believed that they decompose, disproportionate or are reduced to form a coating of the metal reactant, e.g., silicon, in the presence of a coatable substrate.

Figure 2:
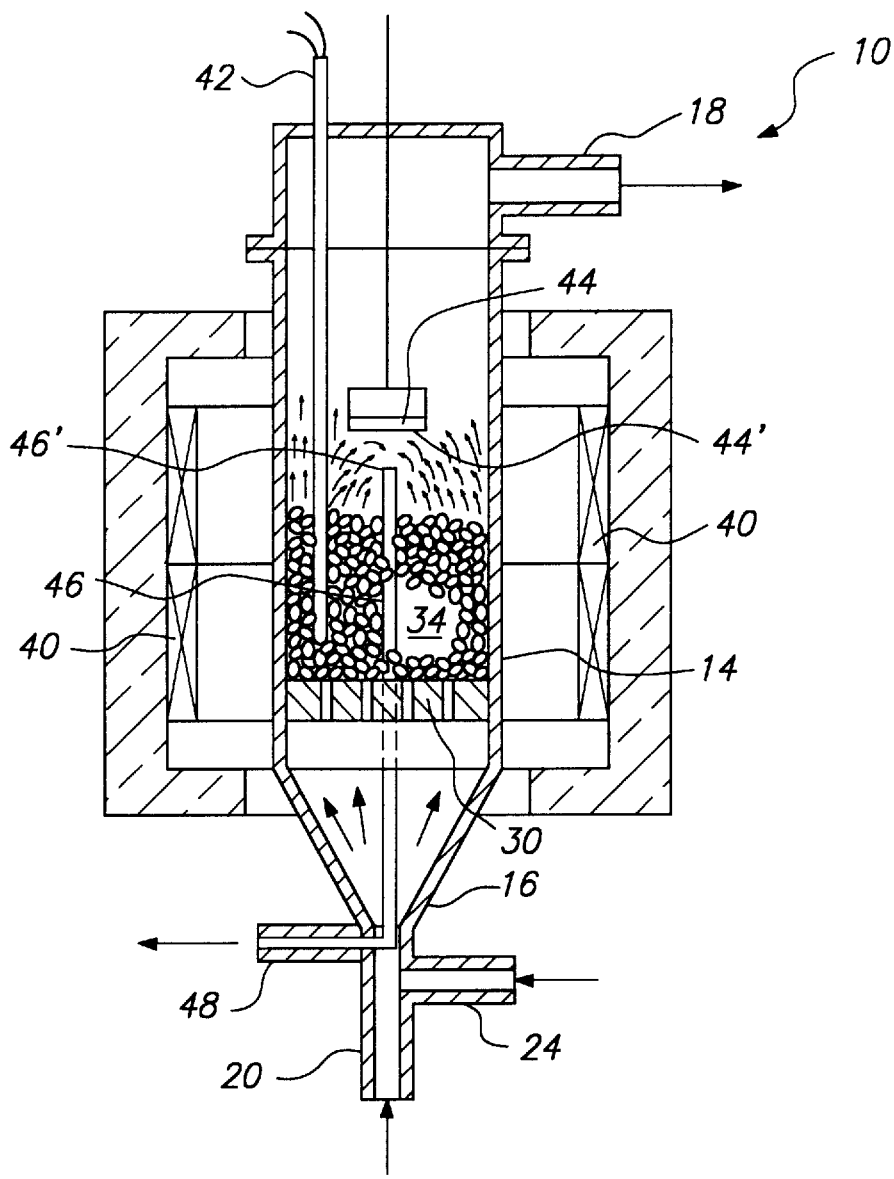
FIG. 2 is a vertical cross-sectional view of a moving bed reactor of the invention having an exhaust outlet situated between the bed and the substrate.
Figure 3:
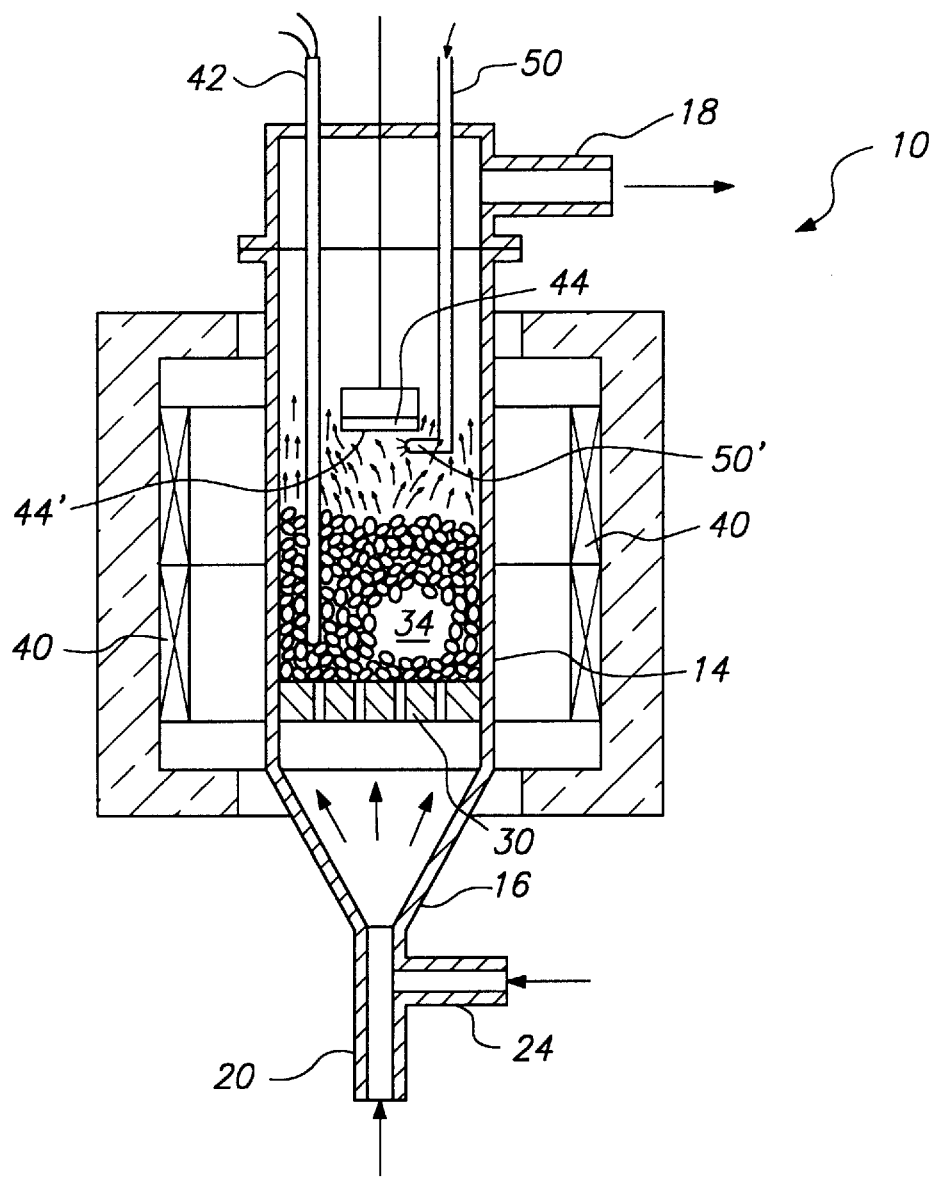
FIG. 3 is a vertical cross-sectional view of a moving bed reactor of the invention having a gas injection inlet situated lateral to the substrate and between the bed and the substrate.

The body of the reactor may comprise any suitable non-reactive containment vessel that is transparent to radiation and that is capable of containing a moving particle bed such as, for example, a fluidized bed. A suitable containment vessel, for example, would be a quartz cylinder. The walls of the reactor are kept hotter than the bed to inhibit deposition on the walls. As shown in FIG. 2 and FIG. 3, a fluidized bed reactor 10 may comprise a cylindrical vessel 14 having an exit port 18 and a tapered lower portion 16 into which the fluidizing gas enters through first port 20 and is mixed with the halogen-containing reactant in gaseous form which enters tapered portion 16 through second port 24.

The gaseous mixture enters first reaction zone 34 through distribution plate 30 located above (as illustrated) or below tapered portion 16 in reactor 10. Above distribution plate 30 is located, in first reaction zone 34, the bed of particles comprising the metal reactant, e.g., silicon particles. Around the outside wall of reactor 10 is placed heating means 40 which may comprise a tubular resistance furnace which cooperates with thermocouple temperature sensor 42 to maintain first reaction zone 34 in reactor 10 within the desired temperature range. When the fluidizing gas mixture containing the halogen-containing reactant enters first reaction zone 34 through distribution plate 30, the metal reactant particles are both fluidized and brought into contact with the halogen-containing reactant to thereby form the reactive intermediate. Upon contact with substrate 44, the reactive intermediate forms a coating thereon.

The reaction time, or residence time, in the first reaction zone required for the metal reactant to react with the halogen-containing reactant to form the reactive intermediate ranges from about 0.1 second to about 100 seconds preferably about 1 second to about 10 seconds.

Substrate 44 is placed above first reaction zone 34 and, as the reaction between the metal reactant and the halogen-containing reactant proceeds, the reactive intermediate thus formed will be carried by the fluidizing gas mixture toward the substrate. Upon disproportionation, decomposition or reduction of the reactive intermediate, the resulting metal will form a coating on substrate 44. Coatings are obtained on substrates located above the bed and maintained at temperatures less than or greater than that of first reaction zone 34, typically in the range of about 50° C. to 500° C., but as much as 1500° C., less than or greater than the temperature of first reaction zone 34.

Substrate 44 may be provided in a form, such as a sheet, a ribbon, or the like, that can be continuously introduced into, moved through, and removed from reactor 10. The moving substrate 44 is fed into the reactor using any means well known in the art at a feed rate sufficient to permit deposition of a coating of a predetermined thickness on the surface of the substrate, e.g., a feed rate in the range of about 1 cm/min to about 1 m/min, more preferably, about 10 cm/min to about 50 cm/min.

In a first embodiment of reactor 10 shown in FIG. 2, exhaust outlet 46 having aperture 46' is situated between first reaction zone 34 and substrate 44. Exhaust outlet 46 is vented through exhaust port 48. Although shown in FIG. 2 as having a single aperture 46', exhaust outlet 46 may also be configured to have multiple apertures. Aperture 46' of exhaust outlet 46 is preferably situated approximately centered with respect to surface 44' of the substrate to be coated. Furthermore, the size of aperture 46' is preferably significantly less than the area of the surface of the substrate to be coated, e.g., in the range of about 0.1% to about 20% of the substrate surface area, more preferably in the range of about 1% to about 10%. Aperture 46' is situated in close proximity to the surface 44' of the substrate to be coated. Preferably, aperture 46' is situated at a distance from the substrate that is significantly less than the radius of the surface 44' of the substrate to be coated, if the substrate is disk-shaped, or less than the smallest dimension defining of the substrate surface area. More preferably, aperture 46' is situated at a distance from the substrate in the range of about 1 mm to about 20 mm, most preferably about 5 mm to about 10 mm. Exhaust outlet 46 vents volatile reaction products drawn therein through exhaust port 48. The exhaust may be vented through the exhaust port under atmospheric pressure or exhaust port 48 may be attached to a means to reduce the pressure at the port to subatmospheric levels, thereby enhancing the draw of gases through exhaust outlet 46. The means to reduce the pressure may be any conventional means known in the art, e.g., a vacuum pump, fan, or the like.

Using a reactor including an exhaust outlet as illustrated in FIG. 2 and a substrate placed several centimeters from the bed, the gas-to-solid mass transfer of silicon to the substrate is increased significantly due to the extraction of gas through exhaust outlet 46. The halometal species generated in the fluidized particle bed is fed homogeneously over the substrate. As illustrated in FIG. 2, the gas flow lines start perpendicular to the bed and substrate surfaces, rise vertically, then progressively bend inward to become parallel to the surface of the substrate and exit vertically near the center of the substrate through exhaust outlet 46.

Placing the exhaust tube near the substrate reduces the thickness of the boundary layer. Increasing the linear flow velocity of the gas bathing the substrate as it approaches exhaust outlet 46 increases the mass transfer rate, as evidenced by a depletion of the gas-phase reactant and the increase in the deposition product concentration (see, FIG. 4 and discussion thereof below).

In a second embodiment of reactor 10 shown in FIG. 3, gas injection inlet 50 is provided. Terminal portion 50' of gas injection inlet 50 is situated lateral to substrate 44 and between first reaction zone 34 and the substrate. In this configuration, gas is introduced from gas injection inlet 50 into the reactor tangential to the flow of reactive gas bathing substrate 44. By "tangential" is meant that the gas is introduced at an angle of about 90° relative to the direction of flow of reactive gas and about 0° to less than about 15° with respect to the center of the substrate. In this manner, a swirling radial gas flow may be effected.

The gas is introduced into the reactor through gas injection inlet 50 at a rate equal to or exceeding the rate at which the fluidizing gas mixture is introduced into the reactor. Preferably the gas is introduced into the reactor at a rate in the range of about 10 cm/sec to about 1000 cm/sec, and more preferably in the range of about 20 cm/sec to about 100 cm/sec. Although any gas can be injected if only to increase the linear flow velocity of the reactive gas bathing the substrate, for example, $H_2$, Ar, Ne, He, $SiH_4$, $N_2$, $NH_3$, $N_2H_4$, $OH_2$, $H_2S$, $C_nH_{2n+2}$, wherein n is an integer between 1 and 3, $B_xH_{2x}$, wherein x is 1 or 2, and mixtures thereof, a preferred gas for tangential injection is $H_2$. $H_2$ serves not only to increase the linear flow velocity of the reactive gas bathing the substrate but also to enrich the gas bathing the substrate in $H_2$.

Figure 4:
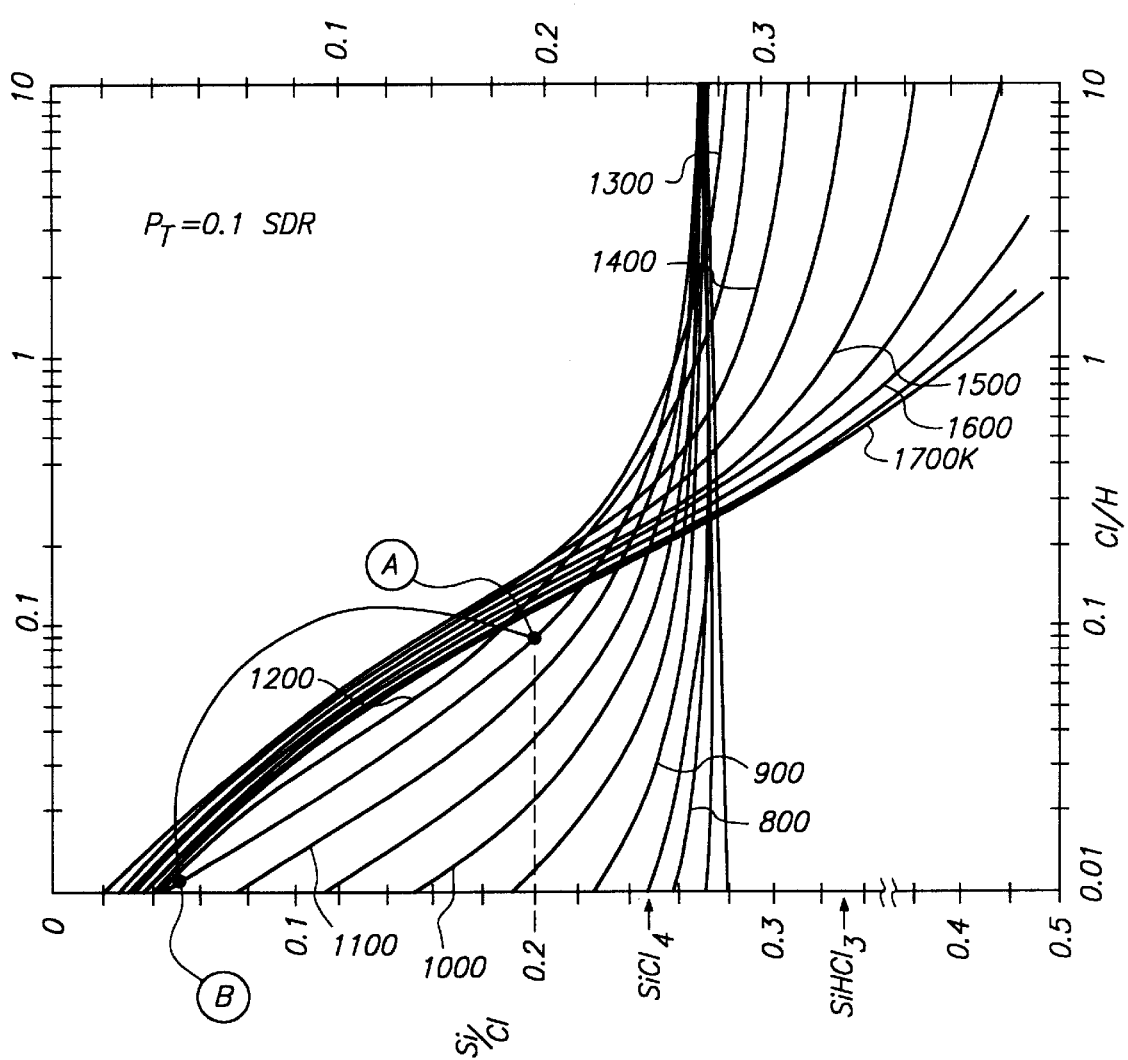
FIG. 4 is a graphical depiction of the decrease in the amount of silicon in the gas phase as the Cl/H ratio is increased in the gas phase at different reactor temperatures.
Figure 5A:
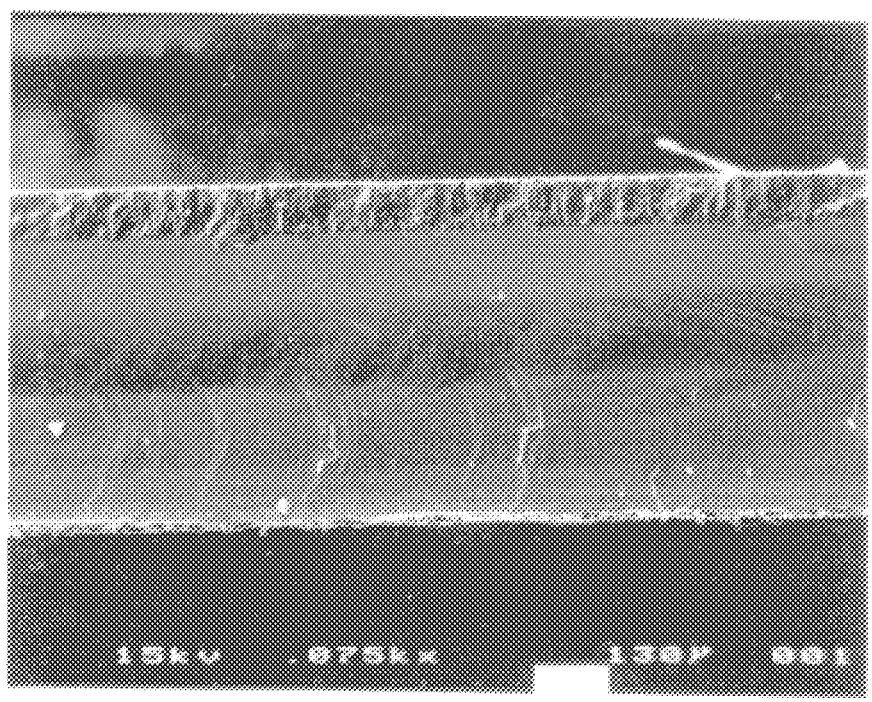
FIG. 5 is a photomicrograph of silicon crystal deposited on a silicon substrate under conditions described in Example 4.
Figure 5B:
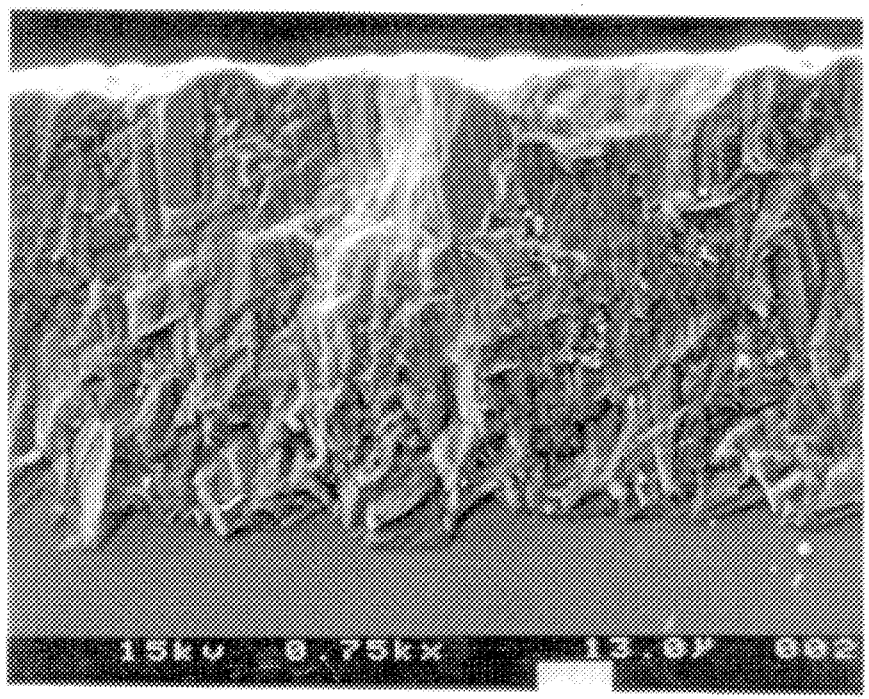

In a third embodiment of the reactor, the reactor comprises both exhaust means 46,46' and gas injection means 50,50'. The addition of a tangential jet of $H_2$ further enhances the gas-to-solid mass transfer rate thus increasing the overall rate of deposition. Furthermore, the injection of $H_2$ changes the thermochemical driving force for deposition. FIG. 4 illustrates that the amount of silicon with respect to chloride in the gas phase decreases for a given temperature with the amount of hydrogen with respect to chloride in the gas phase. That is, as the hydrogen concentration increases, the silicon concentration in the gas phase decreases due to its deposition on the substrate. For example, when the concentration of $H_2$ is increased ten-fold, from a Cl/H of 0.1 to Cl/H of 0.01, the concentration of silicon in the gas phase decreases from about 0.2 to about 0.05. The increase in linear flow velocity and the additional mixing provided by the jet of $H_2$ also contributes to faster, more homogeneous deposition. The simultaneous application of gas extraction and the tangential gas flow provides a synergistic effect to enhance the rate and homogeneity of silicon deposition.

The following examples are intended to provide those of ordinary skill in the art with a complete disclosure and description of how to make and use the novel reactor, and are not intended to limit the scope of what the inventors regard as their invention in any way. Efforts have been made to ensure accuracy with respect to numbers used (e.g., amounts, temperatures, etc), but some experimental error and deviation should, of course, be allowed for. Unless indicated otherwise, parts are parts by weight, temperatures are in degrees centigrade, and pressure is at or near atmospheric. All chemicals, reagents, and the like, are commercially available or are otherwise readily synthesized using conventional techniques well known in the art.

EXAMPLE 1–7

Rate and Thickness of Silicon Metal Deposition Using Different FBR-CVD Reactor Configurations A reactor configured as depicted in FIG. 1 (Examples 1–3), FIG. 2 (Example 4), or FIG. 2 further including a second gas inlet as shown in FIG. 3 (Examples 5–7) was used to coat a circular wafer of silicon (Examples 1–6) or $Si/SiO_2$ (Example 7). The particle bed in the reactor contained particles of silicon and was fluidized by passing gaseous HCl over the particles. The lower furnace temperature ranged between 495° C. and 565° C. and the substrate was maintained at a temperature ranging between 1130° C. and 1215° C. by the use of RE heat. When used, a passive gas outlet was placed 3–4 mm from the center of the surface of the wafer to be coated. A gas inlet was used to provide jet of $H_2$ gas that was tangential to the flow of reactive gas. The configurations of the reactors in Examples 1–7 are summarized in Table 1. Table 2 shows the results of each of the experiments.

TABLE 1

CONFIGURATION OF REACTOR IN EXAMPLES 1–7

| | SUBSTRATE | | | Cl/H[1] | | | | |
|---|---|---|---|---|---|---|---|---|
| EX. NO. | MATERIAL | TEMP. (°C.) | Si BED TEMP (°C.) | THROUGH BED | ABOVE BED | DEPOSITION TIME (MIN) | EXHAUST CONFIGURATION | TANGENTIAL $H_2$ JET |
| 1 | Si(|||)[2] | 1005 | 576 | 0.050 | 0.050 | 30 | NONE | NO |
| 2 | Si(|||) | 1195 | 648 | 0.084 | 0.084 | 5 | NONE | NO |
| 3 | Si(|||) | 1215 | 500 | 0.061 | 0.061 | 30 | NONE | NO |
| 4 | Si(|||) | 1200 | 498 | 0.061 | 0.061 | 30 | SINGLE PASSIVE EXHAUST TUBE | NO |
| 5 | Si(|||) | 1220 | 550 | 0.061 | 0.039 | 30 | SINGLE PASSIVE EXHAUST TUBE | YES |
| 6 | Si(|||) | 1200 | 290 | 0.061 | 0.039 | 30 | SINGLE PASSIVE EXHAUST TUBE | YES |
| 7 | $Si/SiO_2$[3] | 1200 | 295 | 0.061 | 0.039 | 30 | SINGLE PASSIVE EXHAUST TUBE | YES |

[1]Determined from ratios of flow rates.
[2]Si(|||) indicates the silicon wafer has a (|||) orientation.
[3]The silicon wafer was oxidized at 1000° C. for 1 hr to generate as $SiO_2$ surface.

The first three experiments (Examples 1–3) show a rate of silicon deposition of less than 2 µm/min. The experiment conducted according to Example 4 shows that a silicon-deposition rate over 2.8 µm/min can be obtained when the boundary layer is minimized by the use of an exhaust tube. The experiments conducted according to Examples 5–7 show that the combined effect of an exhaust tube and an injection of a gas jet results in silicon-deposition rates greater than 3.5 µm/min.

TABLE 2

EFFECT OF REACTOR CONFIGURATION ON FILM THICKNESS AND DEPOSITION RATE

| EXAMPLE NO. | FILM THICKNESS (µm) | DEPOSITION RATE (µm/min) |
|---|---|---|
| 1 | 14 | 0.5 |
| 2 | 7 | 1.4 |
| 3 | 50 | 1.7 |
| 4 | 83 | 2.8 |
| 5 | 108 | 3.6 |
| 6 | 125–160 | 4.2–5.3 |
| 7 | 154 | 5.1 |

Accordingly, an novel fluidized-bed reactor for depositing a coating of a material on the surface of a substrate is provided herein. Although preferred embodiments of the subject invention have been described in some detail, it is understood that obvious variations can be made without departing from the spirit and the scope of the invention as defined by the appended claims.

We claim:

1. A fluidized-bed reactor for depositing a coating of a material on a surface of a substrate, comprising:
   (a) a first reaction zone containing a fluidized bed of particles comprising a coating source material;
   (b) a means for heating the bed zone;
   (c) a first gas inlet means for introducing a motive stream of reactive gas into the reactor such that the flow of gas in the reactor is in an upward direction;
   (d) a substrate zone situated above the fluidized bed in which the substrate to be coated is situated;

(e) a means for heating the substrate such that the temperature of the substrate is less than the temperature of the bed zone; and (f) a gas outlet located within the reactor above the bed zone and below the substrate zone, in close proximity to the surface of the substrate to be coated.

2. The reactor of claim 1, wherein the gas outlet is in a passive exhaust port.

3. The reactor of claim 1, wherein the gas outlet is in attached to a means for extracting gas from the reactor.

4. The reactor of claim 1, wherein the bed particles comprise a metal reactant M selected from the group consisting of Si, Al, Ti, V, Cr, Zr, Nb, Mo, Hf, Ta, W, and mixtures thereof.

5. The reactor of claim 4, wherein the metal reactant is Si.

6. The reactor of claim 1, wherein the reactive gas is selected from the group consisting of $X_2$, HX, $M'X_a$, $M'X_{(a-b)}H_b$, and mixtures thereof, wherein X is F, Cl, Br, or I, M' is a metal selected from the group consisting of Al, Ti, V, Cr, Zr, Nb, Mo, Hf, Ta, W, Si, Pb, Ge, Ag, Sn, Ga, In, Cu, Se, and mixtures thereof, a is the maximum oxidation state or valence of metal M', and b has a numerical value between 1 and a−1.

7. The reactor of claim 1, wherein the temperature of the first reaction zone is maintained between about 200° C. and 3000° C.

8. The reactor of claim 1, wherein the temperature of the substrate is maintained between about 50° C. and 1500° C. less than the first reaction zone.

9. The reactor of claim 1, wherein the means for heating the first reaction zone is a conduction heating means, convection heating means, resistance heating means, infrared heating means, radio-frequency heating means, or inductive heating means.

10. The reactor of claim 9, wherein the means for heating the first reaction zone is an inductive heating means.

11. The reactor of claim 1, further including a second gas inlet situated within the reactor below the substrate zone and above the first reaction zone, in close proximity to the surface of the substrate to be coated, wherein the second gas inlet introduces a gas tangential to the substrate.

12. The reactor of claim 11, wherein the gas jet comprises a gas selected from the group consisting of $H_2$, Ar, Ne, He, $SiH_4$, $N_2$, $NH_3$, $N_2H_4$, $OH_2$, $H_2S$, $C_nH_{2n+2}$, wherein n is an integer between 1 and 3, $B_xH_{2x}$, wherein x is 1 or 2, and mixtures thereof.

13. The reactor of claim 12, wherein the gas comprises $H_2$.

14. The reactor of claim 11, wherein the gas outlet is in a passive exhaust port.

15. The reactor of claim 11, wherein the gas outlet is in attached to a means for extracting gas from the reactor.

16. The reactor of claim 11, wherein the bed particles comprise a metal reactant M selected from the group consisting of Si, Al, Ti, V, Cr, Zr, Nb, Mo, Hf, Ta, W, and mixtures thereof.

17. The reactor of claim 16, wherein the metal reactant is Si.

18. The reactor of claim 11, wherein the reactive gas is selected from the group consisting of $X_2$, HX, $M'X_a$, $M'X_{(a-b)}H_b$, and mixtures thereof, wherein X is F, Cl, Br, or I, M' is a metal selected from the group consisting of Al, Ti, V, Cr, Zr, Nb, Mo, Hf, Ta, W, Si, Pb, Ge, Ag, Sn, Ga, In, Cu, Se, and a mixture thereof, a is the maximum oxidation state or valence of metal M', and b has a numerical value between 1 and a−1.

19. The reactor of claim 11, wherein the temperature of the first reaction zone is maintained between about 200° C. and 3000° C.

20. The reactor of claim 11, wherein the temperature of the substrate is maintained between about 50° C. and 1500° C. less than the first reaction zone.

21. The reactor of claim 11, wherein the means for heating the first reaction zone is a conduction heating means, convection heating means, resistance heating means, infrared heating means, radio-frequency heating means, or inductive heating means.

22. The reactor of claim 21, wherein the means for heating the first reaction zone is an inductive heating means.

23. A fluidized-bed reactor for depositing a coating of a material on the surface of a substrate, comprising:

(a) a bed zone containing a fluidized bed of particles comprising a reactive coating source material;

(b) a means for heating the bed zone;

(c) a first gas inlet for introducing a motive stream of reactive gas into the reactor such that the flow of gas in the reactor is in an upward direction;

(d) a substrate zone situated above the fluidized bed, in which the substrate to be coated is situated;

(e) a means for heating the substrate such that the temperature of the substrate is less that the temperature of the bed zone; and (f) a second gas inlet within the reactor below the substrate zone and above the bed zone, in close proximity to the surface of the substrate to be coated, wherein the inlet introduces a gas jet tangential to the flow of reactive gas.

24. The reactor of claim 23, wherein the gas jet comprises a gas selected from the group consisting of $H_2$, Ar, Ne, He, $SiH_4$, $N_2$, $NH_3$, $N_2H_4$, $OH_2$, $H_2S$, $C_nH_{2n+2}$, wherein n is an integer between 1 and 3, $B_xH_{2x}$, wherein x is 1 or 2, and mixtures thereof.

25. The reactor of claim 24, wherein the gas comprises $H_2$.

26. The reactor of claim 23, wherein the bed particles comprise a metal reactant M selected from the group consisting of Si, Al, Ti, V, Cr, Zr, Nb, Mo, Hf, Ta, W, and mixtures thereof.

27. The reactor of claim 26, wherein the metal reactant is Si.

28. The reactor of claim 23, wherein the reactive gas is selected from the group consisting of $X_2$, HX, $M'X_a$, $M'X_{(a-b)}H_b$, and mixtures thereof, wherein X is F, Cl, Br, or I, M' is a metal selected from the group consisting of Al, Ti, V, Cr, Zr, Nb, Mo, Hf, Ta, W, Si, Pb, Ge, Ag, Sn, Ga, In, Cu, Se, and mixtures thereof, a is the maximum oxidation state or valence of metal M', and b has a numerical value between 1 and a−1.

29. The reactor of claim 23, wherein the temperature of the first reaction zone is maintained between about 200° C. and 3000° C.

30. The reactor of claim 23, wherein the temperature of the substrate is maintained between about 50° C. and 1500° C. less than the first reaction zone.

31. The reactor of claim 23, wherein the means for heating the first reaction zone is a resistance heating means, infrared heating means, radio-frequency heating means, or inductive heating means.

32. The reactor of claim 31, wherein the means for heating the first reaction zone is an inductive heating means.

33. A fluidized-bed reactor for depositing a coating of a material on a surface of a substrate, comprising:
  (a) a first reaction zone containing a fluidized bed of particles comprising a coating source material;
  (b) a means for heating the bed zone;
  (c) a first gas inlet means for introducing a motive stream of reactive gas into the reactor such that the flow of gas in the reactor is in an upward direction;
  (d) a substrate zone situated above the fluidized bed in which the substrate to be coated is situated;
  (e) a means for heating the substrate such that the temperature of the substrate is greater than the temperature of the bed zone; and
  (f) a gas outlet located within the reactor above the bed zone and below the substrate zone, in close proximity to the surface of the substrate to be coated.

34. The reactor of claim 33, wherein the gas outlet is in a passive exhaust port.

35. The reactor of claim 33, wherein the gas outlet is in attached to a means for extracting gas from the reactor.

36. The reactor of claim 33, wherein the bed particles comprise a metal reactant M selected from the group consisting of Si, Al, Ti, V, Cr, Zr, Nb, Mo, Hf, Ta, W, and mixtures thereof.

37. The reactor of claim 36, wherein the metal reactant is Si.

38. The reactor of claim 33, wherein the reactive gas is selected from the group consisting of $X_2$, HX, $M'X_a$, $M'X_{(a-b)}H_b$, and mixtures thereof,
  wherein X is F, Cl, Br, or I,
  M' is a metal selected from the group consisting of Al, Ti, V, Cr, Zr, Nb, Mo, Hf, Ta, W, Si, Pb, Ge, Ag, Sn, Ga, In, Cu, Se, and mixtures thereof,
  a is the maximum oxidation state or valence of metal M', and
  b has a numerical value between 1 and a−1.

39. The reactor of claim 33, wherein the temperature of the first reaction zone is maintained between about 200° C. and 3000° C.

40. The reactor of claim 33, wherein the temperature of the substrate is maintained between about 50° C. and 1500° C. greater than the first reaction zone.

41. The reactor of claim 33, wherein the means for heating the first reaction zone is a conduction heating means, convection heating means, resistance heating means, infrared heating means, radio-frequency heating means, or inductive heating means.

42. The reactor of claim 41, wherein the means for heating the first reaction zone is an inductive heating means.

43. The reactor of claim 33, further including a second gas inlet situated within the reactor below the substrate zone and above the first reaction zone, in close proximity to the surface of the substrate to be coated, wherein the second gas inlet introduces a gas jet tangential to the substrate.

44. The reactor of claim 43, wherein the gas jet comprises a gas selected from the group consisting of $H_2$, Ar, Ne, He, $SiH_4$, $N_2$, $NH_3$, $N_2H_4$, $OH_2$, $H_2S$, $C_nH_{2n+2}$, wherein n is an integer between 1 and 3, $B_xH_{2x}$, wherein x is 1 or 2, and mixtures thereof.

45. The reactor of claim 44, wherein the gas comprises $H_2$.

46. The reactor of claim 43, wherein the gas outlet is in a passive exhaust port.

47. The reactor of claim 43, wherein the gas outlet is in attached to a means for extracting gas from the reactor.

48. The reactor of claim 43, wherein the bed particles comprise a metal reactant M selected from the group consisting of Si, Al, Ti, V, Cr, Zr, Nb, Mo, Hf, Ta, W, and mixtures thereof.

49. The reactor of claim 48, wherein the metal reactant is Si.

50. The reactor of claim 49, wherein the reactive gas is selected from the group consisting of $X_2$, HX, $M'X_a$, $M'X_{(a-b)}H_b$, and mixtures thereof,
  wherein X is F, Cl, Br, or I,
  M' is a metal selected from the group consisting of Al, Ti, V, Cr, Zr, Nb, Mo, Hf, Ta, W, Si, Pb, Ge, Ag, Sn, Ga, In, Cu, Se, and mixtures thereof,
  a is the maximum oxidation state or valence of metal M', and
  b has a numerical value between 1 and a−1.

51. The reactor of claim 43, wherein the temperature of the first reaction zone is maintained between about 200° C. and 3000° C.

52. The reactor of claim 43, wherein the temperature of the substrate is maintained between about 50° C. and 1500° C. greater than the first reaction zone.

53. The reactor of claim 43, wherein the means for heating the first reaction zone is a conduction heating means, convection heating means, resistance heating means, infrared heating means, radio-frequency heating means, or inductive heating means.

54. The reactor of claim 53, wherein the means for heating the first reaction zone is an inductive heating means.

55. A fluidized-bed reactor for depositing a coating of a material on the surface of a substrate, comprising:
  (a) a bed zone containing a fluidized bed of particles comprising a reactive coating source material;
  (b) a means for heating the bed zone;
  (c) a first gas inlet for introducing a motive stream of reactive gas into the reactor such that the flow of gas in the reactor is in an upward direction;
  (d) a substrate zone situated above the fluidized bed, in which the substrate to be coated is situated;
  (e) a means for heating the substrate such that the temperature of the substrate is greater that the temperature of the bed zone; and
  (f) a second gas inlet within the reactor below the substrate zone and above the bed zone, in close proximity to the surface of the substrate to be coated, wherein the inlet introduces a gas jet tangential to the flow of reactive gas.

56. The reactor of claim 55, wherein the gas jet comprises a gas selected from the group consisting of $H_2$, Ar, Ne, He, $SiH_4$, $N_2$, $NH_3$, $N_2H_4$, $OH_2$, $H_2S$, $C_nH_{2n+2}$, wherein n is an integer between 1 and 3, $B_xH_{2x}$, wherein x is 1 or 2, and mixtures thereof.

57. The reactor of claim 56, wherein the gas comprises $H_2$.

58. The reactor of claim 55, wherein the bed particles comprise a metal reactant M selected from the group consisting of Si, Al, Ti, V, Cr, Zr, Nb, Mo, Hf, Ta, W, and mixtures thereof.

59. The reactor of claim 58, wherein the metal reactant is Si.

60. The reactor of claim 55, wherein the reactive gas is selected from the group consisting of $X_2$, HX, $M'X_a$, $M'X_{(a-b)}H_b$, and mixtures thereof, wherein X is F, Cl, Br, or I, M' is a metal selected from the group consisting of Al, Ti, V, Cr, Zr, Nb, Mo, Hf, Ta, W, Si, Pb, Ge, Ag, Sn, Ga, In, Cu, Se, and mixtures thereof, a is the maximum oxidation state or valence of metal M', and b has a numerical value between 1 and a−1.

61. The reactor of claim 55, wherein the temperature of the first reaction zone is maintained between about 200° C. and 3000° C.

62. The reactor of claim 55, wherein the temperature of the substrate is maintained between about 50° C. and 1500° C. greater than the first reaction zone.

63. The reactor of claim 55, wherein the means for heating the first reaction zone is a resistance heating means, infrared heating means, radio-frequency heating means, or inductive heating means.

64. The reactor of claim 63, wherein the means for heating the first reaction zone is an inductive heating means.

* * * * *